(12) United States Patent
Norris et al.

(10) Patent No.: US 6,842,000 B2
(45) Date of Patent: Jan. 11, 2005

(54) METHOD AND DEVICE FOR ACQUIRING DATA FOR DIFFUSION-WEIGHTED MAGNETIC RESONANCE IMAGING

(75) Inventors: David Norris, Malden (NL); Wolfgang Driesel, Sandersdorf (DE)

(73) Assignee: Max-Planck-Gesellschaft zur Forderund der Wissenschaften E.V., Munich (DE)

( * ) Notice: Subject to any disclaimer, the term of this patent is extended or adjusted under 35 U.S.C. 154(b) by 0 days.

(21) Appl. No.: 10/468,159

(22) PCT Filed: Feb. 21, 2002

(86) PCT No.: PCT/DE02/00647

§ 371 (c)(1),
(2), (4) Date: Aug. 28, 2003

(87) PCT Pub. No.: WO02/068978

PCT Pub. Date: Sep. 6, 2002

(65) Prior Publication Data

US 2004/0071324 A1 Apr. 15, 2004

(30) Foreign Application Priority Data

Feb. 28, 2001 (DE) .......................................... 101 09 511

(51) Int. Cl.[7] ................................................. G01V 3/00
(52) U.S. Cl. ....................................... 324/309; 324/318
(58) Field of Search ................................ 324/309, 318, 324/307, 319, 322; 600/410

(56) References Cited

U.S. PATENT DOCUMENTS

| | | | | |
|---|---|---|---|---|
| 5,560,360 A | * | 10/1996 | Filler et al. .................. | 600/408 |
| 5,684,400 A | | 11/1997 | Tsukamoto et al. | |
| 5,685,304 A | | 11/1997 | Tsukamoto | |
| 5,833,609 A | * | 11/1998 | Dannels et al. .............. | 600/410 |
| 6,265,872 B1 | * | 7/2001 | Heid ........................... | 324/307 |
| 6,323,646 B1 | * | 11/2001 | Zhou et al. .................. | 324/309 |

FOREIGN PATENT DOCUMENTS

| | | |
|---|---|---|
| WO | 9847015 | 10/1998 |
| WO | 0029865 | 5/2000 |

OTHER PUBLICATIONS

Brockstedt et al, "Diffusion Coefficient Maps Using Fast Spin–Echo MRI", Magnetic Resonance Imaging, vol. 16, No. 8, 1988, pp. 877–886, XP00878655.

Norris et al, Online Motion Correction for Diffusion–Weighted Imaging . . . , Magnetic Resonance in Medicine, No. 5, 2001, pp. 729–733, XP001011071.

Latta et al, "Motion Artifacts Reduction in DWI Using Navigator Echoes . . . ", Magnetic Resonance Materials in Physics, 1998, pp. 21–27, XP000874853.

Clark et al, "Improved Reduction of Motion Artifacts in Diffusion Imaging . . . ", Journal of Magnetic Resonance, No. 2, 2000, pp. 358–362, XP002209679.

Anderson et al, "Analysis and Correction of Motion Artifacts in Diffusion Weighted Imaging", Magnetic Resonance in Medicine, No. 3, 1994, pp. 379–387, XP000470232.

Ward et al, "Prospective Multiaxial Motion Correction for fMRI", Magnetic Resonance in Medicine, No. 3, 2000, pp. 459–469, XP002175904.

Aziz Muefit Ulug et al, "Correction of Motional Artifacts in Diffusion–Weighted Images Using a Reference Phase Map", No, 3, 1995, pp. 476–480, XP000527029.

* cited by examiner

Primary Examiner—Brij B. Shrivastav
(74) Attorney, Agent, or Firm—Dennison, Schultz, Dougherty & MacDonald

(57) ABSTRACT

The invention relates to a magnetic resonance imaging method which is characterized in that the transversal magnetization excited in the object to be imaged is diffusion-weighted before the useful echo (E) used for the reconstruction of an image is induced. When the object is moved, phase changes in the diffusion-weighted transversal magnetization can occur that lead to artifacts in the reconstructed image. These disturbing phase changes are measured by analyzing a navigation signal ($N_1$, $N_2$) that is generated before the useful signal is generated. The result of the measurement is used to change the phase characteristics of the transversal magnetization online by a correctional intervention ($C_0$, $C_1$, $C_2$) in such a way that the measured phase changes are compensated. The invention further relates to a magnetic resonance device for carrying out said method.

32 Claims, 6 Drawing Sheets

METHOD AND DEVICE FOR ACQUIRING DATA FOR DIFFUSION-WEIGHTED MAGNETIC RESONANCE IMAGING

This application is a 371 of PCT/DE02/00647, filed on Feb. 21, 2002.

DESCRIPTION

The present invention relates to the locally resolved examination of objects by means of magnetic resonance (MR) and relates specifically to a method for acquiring data for the illustration of an image which shows the spatial distribution of the MR-behaviour of an object within a selected local area, thus highlighting diffusion phenomena, according to the preamble of claim 1. The invention further relates to a device for performing the method.

In reference to and acknowledgement of the prior art, the description hereinunder includes appropriate references in the freely available specialist literature:

[1] E. O. Stejskal, J. E. Tanner. "Spin diffusion measurements: spin echoes in the presence of a time-dependent field gradient". J Chem Phys, 42:288–292, 1965.
[2] V. Waluch, W. G. Bradley. "NMR even echo rephasing in slow laminar flow". J Comput Assist Tomogr, 8:594–8, 1984.
[3] G. L. Nayler, D. N. Firmin, D. B. Longmore. "Blood flow imaging by cine magnetic resonance". J Comput Assist Tomogr, 10:715–22, 1986.
[4] A. Haase, J. Frahm, D. Matthaei, W. Hänicke, K.-D Merboldt. "FLASH imaging, rapid NMR imaging using low flip-angle pulses". J. Magn. Reson., 67:258–266, 1986.
[5] J. A. Utz, R. J. Herfkens, G. Glover, N. Pelc N. "Three second clinical NMR images using a gradient recalled acquisition in steady state mode (GRASS)". Magn Res Imag, 4, Supplement: 106, 1986.
[6] M. L. Gyngell. "The application of steady-state free precession in rapid 2DFT NMR imaging: Fast and CE-Fast sequences". Magn Res Imag, 6:415–419, 1988.
[7] J. Henning, A. Nauerth, H. Friedburg. "RARE imaging: a fast imaging method for clinical MR". Magn Reson Imag, 3:823–833, 1986.
[8] W. H. Perman, M. Gado, J. C. Sandstrom. "DPSF: snapshot FLASH diffusion/perfusion imaging". In: Proceedings: $9^{th}$ Annual Meeting of the Society of Magnetic Resonance in Medicine; New York, page 309, 1990.
[9] U. Sinha, S. Sinha. "High speed diffusion imaging in the presence of eddy currents". J Magn Reson Imag, 6:657–66, 1996.
[10] K. D. Merboldt, W. Hänicke, H. Bruhn, M. L. Gyngell, J. Frahm. "Diffusion imaging of the human brain in vivo using high-speed STEAM MRI". Magn Reson Med, 23:179–192, 1992.
[11] M. N. Yongbi, S. Ding, J. F. Dunn. "A modified sub-second fast-STEAM sequence incorporating bipolar gradients for in vivo diffusion imaging". Magn Reson Med, 35:911–916, 1996.
[12] D. G. Norris, P. Börnert, T. Reese, D. Leibfritz. "On the application of ultra-fast RARE experiments". Magn Reson Med, 27:142–164, 1992.
[13] D. G. Norris, P. Börnert. "Coherence and interference in ultra-fast RARE experiments" J Magn Reson A, 105:123–127, 1993.
[14] F. Schick. "SPLICE: sub-second diffusion-sensitive mr imaging using a modified fast spin-echo acquisition mode". Magn Reson Med, 38:638–644, 1997.
[15] G. Wider, V. Dötsch, K. Wüthrich. "Self compensating pulsed magnetic-field gradients for short recovery times" J Magn Reson A, 108:255–258, 1994.
[16] K. Oshio, D. A. Feinberg "GRASE (Gradient and spin-echo) imaging: a novel fast MRI technique". Magn Reson Med, 20 (2) :344–9, August 1991.
[17] F. Schmitt, M. K. Stehling, R. Turner. "Echo-planar imaging theory, technique and application". Springer, Berlin, 1998.
[18] C. B. Ahn, J. H. Kim, Z. H. Cho. "High-speed spiral-scan echo planar NMR imaging-I". IEEE Trans. Med. Imag., MI-5:2–7, 1986.
[19] K. Butts, J. Pauly, A. de Crespigny, M. Moseley. "Isotropic diffusion-weighted and spiral-navigated interleaved EPI for routine imaging of acute stroke". Magn Reson Med, 38:741–749, 1997.

These references are identified in the text of the description by the indication of the above reference numbers in square brackets [ ].

In the case of the typical MR-imaging methods, the object area which is to be examined, i.e. the "sample" is disposed in a stationary magnetic field $B_0$ and is subjected to a sequence of at least one electromagnetic high-frequency pulse (HF-pulse) of a selected frequency and to subsequent pulses of magnetic field gradients in various spatial directions, such that the HF-excitations cause echoes to occur which are detected as the MR-signal and provide information relating to the properties of the sample.

The energy content of an HF-pulse determines the amount of excited spin which is capable of emitting an MR-signal (transversal magnetisation) in ratio to the spin at equilibrium (longitudinal magnetisation). The arc tangent of this ratio is defined as the flip-angle of the HF-pulse.

The resonance frequency of the spins and thus the frequency both of an exciting HF-pulse and also the measurable MR-signals is determined inter alia by the local magnetic field strength. Therefore, for the purpose of achieving local resolution a so-called "read gradient" is imposed in all imaging methods in a selected spatial direction during signal detection, in order to allocate in each case various frequencies in the signal to different locations along this direction (frequency-encoding). A Fourier-transformation renders it possible to separate the various frequencies and thus the contributions of various locations. In this manner, it is possible to achieve local resolution in the relevant spatial direction which is also defined as "read direction" (abbreviated as R-direction).

For the purpose of achieving local resolution in a second spatial direction which is preferably orthogonal to the read direction, it is generally the case that a gradient is temporarily imposed in this direction prior to the occurrence of the signal which is to be detected, which ensures that the oscillations (spins) excited in the sample dephase along the relevant spatial direction. The step-wise change to the time integral of this "phase-encoding gradient" from echo to echo causes the phase of the signal contribution originating from a location to change from echo to echo. The signal contributions of the various locations along this direction which is also defined as the "phase-encoding direction" (abbreviated as: P-direction) can be separated from each other by means of a Fourier-transformation in relation to the current number of echoes. Since frequency and phase are each separately dependent upon the position along two spatial co-ordinates (R- and P-direction), it is possible to reconstruct a two-dimensional image of the object.

A location is selected in a third spatial direction, which is preferably orthogonal to the plane of the R- and P-directions and is also defined as the "layer direction" (abbreviated as: S-direction), by applying a gradient in this direction during the exciting, frequency-selected HF-pulse.

This "layer gradient" enables a layer to be selected in the object for excitation purposes.

Most common MR-imaging methods operate with the above-described combined frequency and phase-encoding. For the illustration of e.g. a two-dimensional N-cell image, N echoes are consecutively generated, each one with a different phase-encoding, and each echo of this N-echo sequence is frequency-encoded in the same manner by the read gradient and is detected as an MR-signal. From the scanning values of the detected signals it is possible to form a two-dimensional matrix of data, the so-called K-space, of which each row or "line" is allocated to a different frequency-encoded echo and contains scanning values of the relevant echo. The line direction is also defined as the frequency axis of the K-space. The axis of the K-space which is orthogonal thereto is scaled as phase co-ordinates, i.e. the position of a row along this axis is determined by the integral of the phase-encoding gradient. The data matrix organised in this way is then subjected to a two-dimensional Fourier-transformation (2D-FT), in order to acquire the pixel values of the image.

Other less conventional MR-imaging methods (Projection Reconstruction Imaging, Spiral Imaging) also scan the 2D-K-space, wherein the strict separation between phase-encoding and read gradient direction is not undertaken in these methods. Using this method, the K-space is generally scanned non-equidistantly and in non-right angle trajectories. Therefore, different image reconstruction methods must also be used for these processes.

A distinction is made between three different types of MR-signals. The so-called "spin echo-signal" is produced by refocussing the magnetic field homogeneity effects by means of an additional HF-pulse which is excited for a specific period of time after the first HF-excitation pulse. The so-called "gradient echo-signal" is generated by polarity inversion of a magnetic field gradient (typically the read gradient), thus serving to refocus the dephasing created by the previous effect of this gradient. So-called "stimulated echoes" are produced after a sequence of at least three HF-pulses with flip-angles $\neq 180°$.

The total echo sequence required to record an N-cell image can be generated by the most varied MR-partial experiments, wherein each partial experiment can be composed of a single sequence or by multiple repetition of identical sequences of HF-pulses and magnetic field gradient-switching procedures.

In addition to the density of the spins which can be influenced by the HF-pulses, the features of a sample which can be analysed by magnetic resonance include various relaxation time constants of spin magnetisation, inter alia the spin-grid relaxation time T1, the spin-spin relaxation time T2 and the effective spin-spin relaxation time T2*. Macroscopic flow phenomena in the sample and diffusion procedures are features which can be rendered visible by MR-imaging. By specifically selecting the type of MR-sequence and the amplitude and time relations of HF- and gradient pulses within the sequence, it is possible to ensure that the strength of the generated MR-signals or echoes depend considerably upon respectively determined, selected features of the sample. As a consequence, it is possible to generate an image, of which the contrast is "weighted" by the relevant feature.

The diffusion-weighted MR-imaging has become more significant in the last ten years, e.g. for the early detection of brain infarcts. There are various methods for diffusion-weighting the MR-signal; the standard method has its origins in the Stejskal-Tanner-Experiment from 1965, cf. [1]. This is a spin echo-sequence with a 90°-excitation pulse and a subsequent 180° refocussing pulse, wherein prior to and after this refocussing pulse a gradient pulse of amplitude G and duration $\delta$ is applied in each case and the time interval from the beginning of the first to the beginning of the second gradient pulse is equal to $\Delta$, as shown in FIG. 1 of the accompanying drawings. Examples of modified forms of diffusion-weighting pre-experiments are illustrated in FIGS. 2 and 3. FIG. 2 illustrates the double spin echo pre-experiment with two pairs of bipolar diffusion gradients, of which each has the amplitude G and the duration $\delta$, wherein $\Delta$ is the time from the beginning of the first gradient of the first pair until the beginning of the first gradient of the second pair and a is the duration of the interval between the two gradients of each pair. FIG. 3 shows a pre-experiment operating with a stimulated echo, wherein three consecutive 90°-HF-pulses are applied; prior to the second and after the third HF-pulse a diffusion gradient of amplitude G and duration $\delta$ is applied in each case, wherein the interval from the beginning of the first until the beginning of the second gradient pulse is equal to $\Delta$.

These and similar pre-experiments ensure that a molecular movement which occurs in the observed volume as a result of diffusion produces an attenuation in the amplitude of the MR-signal, according to the following equation $$S = S_0 \exp(-bD), \quad \text{Equation (1)}$$

Where D is the diffusion constant. The variable b (so-called b-value) is dependent upon the parameters of the respective pre-experiment and upon the gyro-magnetic ratio $\gamma$. The following equation applies for the examples shown in FIGS. 1 and 3:

$$b = (\delta \cdot \gamma \cdot G)^2 \left(\Delta - \frac{\delta}{3}\right) \quad \text{Equation (2)}$$

The following equation applies for the example shown in FIG. 2:

$$b = (2 \cdot \delta \cdot \gamma \cdot G)^2 \left(\Delta - \frac{a}{2} - \frac{2 \cdot \delta}{3}\right) \quad \text{Equation (3)}$$

In order to obtain effective diffusion-weighting, i.e. effectively identifiable attenuation determined by diffusion, it is generally the case that b-values in the range of 500–1000 s/mm² are required. For example, for a pre-experiment as shown in FIG. 1 it is possible with the dimensioning of G=40 mT/m, $\delta$=20 ms and $\Delta$=30 ms to achieve a b-value of 580 s/mm² for protons. As is known, diffusion-weighted sequences are also sensitive to coherent movement. In the event of macroscopic movement of the sample, a phase change in the MR-signal is produced which is dependent upon the local velocity v. For the examples shown in FIGS. 1 and 3, the following equation applies with regard to the phase:

$$\Phi = \gamma \cdot G \cdot v \cdot \delta \cdot \Delta \quad \text{Equation (4)}$$

And the following applies for the example shown in FIG. 2

$$\Phi = 2 \cdot \gamma \cdot G \cdot v \cdot \delta \cdot \Delta \quad \text{Equation (5)}$$

If the above dimensioning example is taken as a basis, then for a macroscopic movement at a velocity of v=0.5 mm/s a phase change equal to $\pi$ is produced.

The movement of a rigid body can be described completely by the provision of the vector of translation and the vector of rotation. The rotation leads to a phase gradient of the MR-signal which passes spatially over the object, wherein the vector describing this gradient is provided by the following equation:

$$\vec{r}_\Phi = \gamma \vec{G} \times \vec{\Omega}$$  Equation (6)

where $\vec{G}$ and $\vec{\Omega}$ indicate the directions of the diffusion-weighting gradient or rotation vector. If in the case of diffusion-weighting sequences the direction of $\vec{\Omega}$ is a function of time, then the phase gradient which passes over the object at the end of the diffusion-weighting time period can be obtained by appropriate modification of equation (6).

Macroscopic movements of the sample cannot be ruled out in many cases, in particular if this concerns living objects. In the case of in vivo examinations on humans and animals, desired and physiologically determined movements (i.e. as a result of breathing or heart beat) are not to be prevented. With regard to the examined object area, such movements are comparable with the movement of a rigid body, i.e. "solid movements"; as a rule they are much greater than the molecular movement (in the order of magnitude of 10 $\mu$m/100 ms), to which a diffusion-weighted MR-experiment is sensitive. Whereas in this case the diffusion always only leads to an attenuation in the MR-signal without any phase change, the macroscopic movement of a rigid body during translation causes a shift of the phase and during rotation causes a gradient in the phase distribution.

To achieve diffusion-weighted MR-imaging, it is possible to modify a conventional MR-imaging sequence by introducing any diffusion-weighting pre-experiment, e.g. one of the pre-experiments shown in FIGS. 1 to 3. In the case of imaging sequences, the described phase changes which are determined by movement are interference variables which can cause artefacts in the reconstructed image. In this way, the said phase changes can interfere under certain circumstances with the phase information which is introduced into the MR-signal to achieve local resolution (phase-encoding), so that in the reconstructed image disturbing phenomena, such as e.g. ghost images, become visible. Accordingly, it is desired in the case of diffusion-weighted MR-imaging to minimise the influence of phase changes, which are determined by movements, upon the illustration of the image. This can be achieved in various ways: (a) the application of imaging sequences which in their own right are not sensitive to solid movements; (b) the application of imaging sequences which by virtue of auxiliary measures are rendered substantially insensitive to solid movements; (c) methods to correct the influences of phase changes which are determined by movements.

A common sequence which is not sensitive to movement is the sequence including so-called "velocity-compensation", frequently applied for the purpose of eliminating both undesired phase changes as well as undesired signal losses which are caused by phase dispersion which is determined by velocity, cf. [2] and [3]. In principle, it is possible to achieve compensation up to each desired time derivation (the location itself, velocity, acceleration, change in acceleration, etc.). However, as a result of the technique of this velocity-compensation sensitivity to diffusion is reduced, i.e. the strength of the diffusion-weighting and thus the diffusion contrast in the image becomes relatively small.

A second imaging method which is not sensitive to movement is the so-called EPI ("Echo Planar Imaging"), in which a single HF-excitation serves to generate a rapid sequence of echoes by the rapid alternation of the polarity of the read gradient, which can and must occur within a very short time period of 20–80 ms, so that movements scarcely have an effect. However, the spatial resolution of an image recorded using this type of EPI is low, as the number of consecutively detectable echoes is very limited because the echo amplitude falls with the time constant of the naturally short effective spin-spin relaxation time T2*.

Of course, imaging methods, in which there is absolutely no phase-encoding which could interfere with these phase changes are also not very sensitive to phase changes of the MR-signal which are determined by movement. These methods include the techniques referred to as "Projection Reconstruction" (PR) and "Line Scanning" (LS). In the case of the PR-method, the direction of the read gradient from echo to echo is rotated in each case through an angle step, so that the echoes include consecutive projections of the sample volume from different angles of view (similar to the projections in X-ray computer tomography), from which the pixels of the entire image can then be calculated. In principle, the PR-method can be applied in the most varied MR-sequences, in order to replace the phase-encoding normally used therein. However, one disadvantage is the high degree of sensitivity of image quality to inhomogeneities which lead to blurred images. In the case of the aforementioned LS-method, imaging is only performed in a one-dimensional manner as a line projection, using two orthogonal layer gradients. It is possible to extend this to a two-dimensional illustration of the image by the acquisition of several parallel lines. However, it is disadvantageous that this method requires lengthy repetition times and in the case of diffusion-weighting, as compared with imaging operating with phase-encoding, causes a loss in measuring sensitivity by the factor √N, if N is the number of recorded lines.

In addition to EPI, there are essentially only two further acquisition techniques which are currently widely used for MR-imaging, namely the sequence (and variations thereof) which are known by the term FLASH, cf. [4], [5], [6], and the sequence known by the term RARE (often also referred to as Fast Spin-Echo or Turbo Spin-Echo), cf. [7]. However, it has hitherto been impossible using any of these sequences to obtain artefact-free, diffusion-weighted images when the object performs solid movements, unless certain compromises were made, as set forth hereinunder:

FLASH consists of a sequence of partial experiments with a short repetition time TR<<T1, in each case containing an excitation with a flip-angle<90° and subsequent echo generation by polarity inversion of the read gradient. In this case, there is scarcely opportunity to introduce an effective diffusion-weighting between the excitation and the echo-acquisition, as in this case the echo time would be too long, much longer than T2*, so that inhomogeneities of the $B_0$-field would lead to considerable artefacts.

One way of diffusion-weighting a FLASH-sequence would be through preparatory magnetisation which must move in the direction of the longitudinal axis. That is to say, when using the classic Stejskal-Tanner-Sequence the transversal magnetisation would then have to be driven back by means of a 90°-HF-pulse in the longitudinal direction ("Driven Equilibrium") which is known per se as DEFT-sequence, cf. [8]. However, since any solid movements of the object change the phase of the magnetisation, before the driven-back 90°-pulse is applied, a direct signal loss is caused. One known attempt at resolving this problem, as proposed in [9], is to introduce a dephasing gradient pulse into the DEFT-sequence shortly before the last 90°-pulse and to introduce a gradient pulse of the same pulse area (time integral over amplitude) into the FLASH-sequence between excitation and echo-acquisition. Although this produces complete movement-independence of the MR-signal, it unfortunately also leads to a reduction in the signal strength (measuring sensitivity) of about 50%.

Another way of diffusion-weighting FLASH is provided by the use of a preparatory sequence for generating stimulated echoes, a so-called STEAM-sequence, wherein instead of the last 90°-pulse of a standard-STEAM-sequence it is the consecutive FLASH-partial experiments which are added on. In this case, there are two known proposals for diffusion-weighting. A first proposal (cf. [10] makes use of the fact that the "mixing time" TM in a STEAM-sequence is limited by T1 and not by T2 and it is thus possible in diffusion-weighting to select the value $\Delta$ to be greater than in the case of a corresponding spin echo sequence. Therefore, in order to achieve the same b-value it is possible to reduce both variables G and $\delta$ according to equation (2) above to such an extent that the diffusion-weighting gradient can be introduced into the FLASH-sequence without excessively extending the echo time. A second proposal (cf. [11]) is to introduce between the first two 90°-pulses of the STEAM-sequence a bipolar gradient pulse to achieve complete diffusion-weighting, and to leave the FLASH-sequence itself unmodified. However, the use of stimulated echoes unfortunately also leads to a 50% loss in signal strength.

RARE is a rapid spin echo sequence, in which the transversal magnetisation which is excited after a 90°-pulse is refocussed several times by a chain of consecutive HF-pulses, in order to generate a corresponding chain of spin echoes. This type of sequence can only provide artefact-free images if the Carr-Purcell-Meiboom-Gill condition (so-called CPMG-condition) is met, which prescribes an exact phase relation between the transversal magnetisation and the phase of the refocussing HF-pulses. It is therefore readily possible to appreciate that a diffusion-weighting preparatory experiment can introduce artefacts. If these refocussing HF-pulses were pure 180°-pulses, then it would be possible to correct the phase of the magnetisation prior to the reconstruction of the image. However, this is unrealistic for echo sequences, in which more than only a few HF-pulses are utilised, unless particular additional measures are undertaken. Diffusion-weighted images were obtained for echo sequences with up to 16 refocussing HF-pulses. If their flip-angles are less than 180°, then interference between the group of echoes with even parity and the group of echoes with odd parity leads to signal losses. Known proposals for solving this problem provide for eliminating one of the two groups and thus removing the problem of meeting the CPMG-condition (cf. [12], [13]) or for acquiring the two groups separately (cf. [14]). All of this adversely affects the measuring sensitivity of the sequence as a whole which is reduced by a factor of 2.

Methods are also known for correcting the undesired effects of solid movements of the object, so that it is not necessary to be restricted to using movement-insensitive sequences or to making movement-sensitive sequences insensitive to movement by the introduction of particular measures. The most important correction method includes the use of so-called "navigator echoes". The basic idea behind this method is to introduce, in conjunction with each diffusion-weighting experiment, a navigator experiment, wherein an additional echo is acquired as the said navigator echo without any phase-encoding. The phase shift measured in the selected navigator echo is then used for correcting the phase in the echoes of the actual imaging sequence. This is sufficient for compensating for translatory movement; however a rotation which produces a phase gradient in parallel with the direction of the read gradient requires a phase correction of the first order, and phase gradients which are orthogonal to the said direction lead to a signal loss which cannot be corrected. Therefore, it has been hitherto recommended only to use the correction with the navigator echo, if the diffusion-weighting gradient extends in parallel with the direction of the phase-encoding gradient; however, this is an unfeasible restriction for some imaging sequences.

It is possible to perform a more comprehensive correction if a two-dimensional navigator experiments is used. This makes it possible to compensate also for phase gradients which are determined by movement and which move in the direction of the phase-encoding gradient. The correction is made by virtue of the fact that the acquired data are brought retrospectively to the "correct" position in the K-space, i.e. to the particular co-ordinate which corresponds to the sum of the phase gradient, which is produced by movement, and of the phase-encoding gradient. Upon conversion of the grid in the K-space to an equidistant matrix "Regridding" it is possible for the image reconstruction to take place. However, there is no guarantee that the Nyquist-theorem will be satisfied because the phase gradients can be different for each combination of diffusion-weighting and movement. The above equation (6) defines the plane, in which the phase gradient generated by rotation must lie. The most effective way of perfectly correcting effects of rotation is to scan this plane in its entirety, e.g. by means of spiral scanning. The use of two orthogonal navigator selections is adequate in many cases; however, if the centre of the K-space is displaced by the rotation to a location remote from both axes, the resulting signal loss can render the entire correction ineffective.

As set forth above, in many known movement-correction methods it is necessary with regard to diffusion-weighted MR-imaging to accept irretrievable signal losses. It is the object of the invention to provide a technique for a movement correction, which operates with navigator information, in diffusion-weighted MR-imaging, wherein losses of this kind are substantially obviated. In accordance with the invention, this object is achieved by the method features combined in claim 1.

Accordingly, the starting point of the invention is a method of acquiring data for the illustration of an image which shows the spatial distribution of magnetic resonance behaviour of an object within a selected object area which is disposed in a stationary and in the most homogenous possible longitudinal magnetic field and is subjected to a sequence of HF-pulses and magnetic field gradient pulses in different spatial directions, such that a sequence of useful echoes, encoded in dependence upon the location, of the magnetisation which is transversal with respect to the stationary magnetic field is produced which useful echoes are acquired as a data record for the reconstruction of the image to be illustrated, wherein between an HF-pulse, which excites the transversal magnetisation, and the production of the useful echoes a diffusion-weighting sequence is introduced which leads to an attenuation in the transversal magnetisation which is dependent upon the diffusion procedures in the selected object area, and wherein from this diffusion-weighted transversal magnetisation a navigator signal is produced by echo-generation and its characteristic is used as information for the correction of image artefacts which are produced by movement of the object. The invention is characterised in that prior to the production of the useful echoes at least one of those interference variables in the phase characteristic of the navigator signal, which would cause the said image artefacts, is measured and that the result of this measurement is utilised in order to change the phase characteristic of the transversal magnetisation, from which the useful echoes are generated, for the purpose of compensating for the measured variable.

The invention thus provides a way of correcting "online" the phase changes which are introduced by object movements in the case of diffusion-weighting, i.e. not only after the acquisition of the MR-useful signals which contain the locally resolved image information for writing into the K-space. At the time of their acquisition, the useful signals are already free of the disturbing components determined by movement, so that in order to suppress image artefacts determined by movement, it is no longer required to manipulate the data for the reconstruction of the image. The disadvantages associated with this type of manipulation, in particular the risk of not satisfying the Nyquist-theorem and the burden of an additional conversion algorithm are thus eliminated.

The invention permits the use of numerous different types of imaging sequences, also those which were hitherto not accessible owing to the anticipated movement artefacts of diffusion-weighting or which had to be rendered insensitive to movement as a compromise. This has taken away the need for such compromises, in particular the acceptance of a 50% signal loss. Especially in the case of a diffusion-weighted RARE-sequence, the correction method in accordance with the invention also has the additional advantage that in spite of a solid movement of the object it is possible to meet the CPMG-condition for all HF-refocussing pulses. It is known that if this condition is not met an irreversible signal loss will result which cannot be corrected by subsequent phase correction after acquisition.

The essential features of a device for performing the method in accordance with the invention are listed in claim 17. Advantageous embodiments of the invention are characterised in each case in subordinate claims.

In order to illustrate the invention in greater detail, a preferred embodiment will first be described hereinunder with reference to Figures of the accompanying drawings. This embodiment includes the application of the inventive correction method for diffusion-weighted MR-imaging with a RARE-sequence and is only an example to which the invention is naturally not limited. In the drawings, FIGS. 1, 2 and 3 are time diagrams for various forms of diffusion-weighting preparatory experiments;

It may be mentioned that the illustrated time diagrams are not drawn to scale, i.e. the individual time sections and the amplitudes are not drawn in accordance with their actual mutual size ratios.

Figure 4:
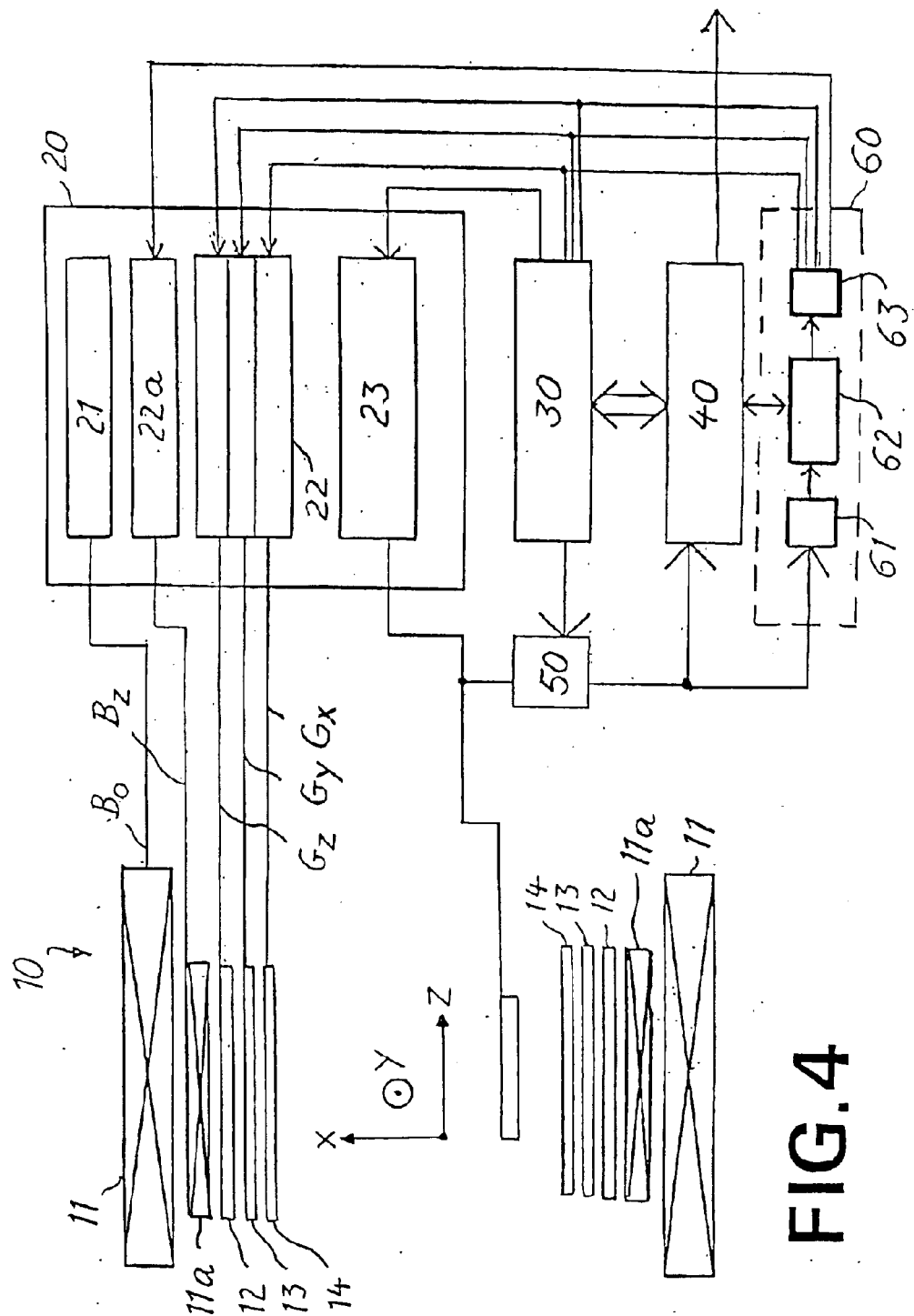
FIG. 4 shows schematically and partially in block form the structure of a device for MR-imaging using devices for performing the method according to the invention.

Methods in accordance with the invention can be performed using an MR-device, as shown in a greatly simplified block illustration in FIG. 4. The illustrated MR-device contains a measuring station 10, a power supply part 20, a control part 30 and a computer 40. As is conventional, the measuring station 10 can contain a magnet 11 for generating a constant, homogenous ("longitudinal") $B_0$-field, furthermore three coil sets 12, 13, 14 which are spatially arranged and wound in such a manner that they can generate magnetic fields which impose upon the $B_0$-field three gradients $G_x$, $G_y$ and $G_z$, of which generally one ($G_z$) is in parallel with the $B_0$-field and the other two ($G_x$ and $G_y$) are directed perpendicularly with respect to the $B_0$-field and perpendicularly with respect to each other. Through the combined simultaneous excitation of selected samples of the coil sets 12, 13, 14 it is possible to generate resulting magnetic field gradients in each case with a selectable level of strength and in any spatial directions.

Moreover, the measuring station 10 is provided with a coil arrangement 15, to which HF-pulses can be transmitted, including the HF-pulses required for exciting and for refocussing transversal magnetisation. This HF-coil 15 generally also serves to receive the MR-signals irradiated from the object. The power supply part 20 contains a power supply unit 21 for the $B_0$-magnet 11, a power supply unit 22 for the gradient coils 12, 13, 14 and a high frequency generator 23 which provides the HF-pulses for the coil 15. The control part 30 controls the duration and amplitude of the currents supplied to the respective gradient coils and controls the duration, amplitude, frequency, phase and envelope curve of the HF-pulses. The control part 30 also controls the selection of the MR-signals, which are received by the HF-coil 15, to the computer 40 in selected time periods and with a selected scanning frequency, as indicated by the illustrated gate circuit 50. The selected scanning values are digitised and stored in a memory forming the K-space. The A/D-converter required for digitisation and the memory can be integrated in the computer 40.

MR-systems of this type which have been described up to this point are known and are commercially available, so that it is not necessary to provide any further explanation relating to details of equipment. What is new and is formed in accordance with the present invention is an additional correction control path 60 which leads from the output of the selection circuit 50 to the gradient coil supply unit 22 and to a power supply unit 22a for an additional coil 11a. This coil 11a is arranged in such a manner that upon excitation it generates a homogenous magnetic field $B_z$ which in the examined object area is in parallel with the $B_0$-field and has a uniform field strength over this area, in order optionally to amplify or attenuate the $B_0$-field (depending upon polarity).

The additional control path 60 can optionally be switched on and in the same way as the computer 40 it receives the MR-signals provided by the selection circuit 50 and serves to correct, in accordance with the invention, phase changes which are determined by movement. In the illustrated example, it contains a dedicated A/D-converter 61, a correction processor 62 and driver or actuation circuits 63 for the coil supply units 22 and 22a. The control path 60 can be formed by separate hardware or can be integrated, wholly or partially, in the control part 30 or can jointly use parts of the computer 40.

From the data written into the K-space memory, the computer 40 acquires by mathematical transformation the pixel matrix for the image reproduction. The control part 30 for dimensioning time, frequency, phase and amplitude parameters for the HF-pulses, for generating the actuation signals for the magnetic field gradients in the preparatory and imaging sequences and for activating the selection circuit 50 is programmed in each case so that the procedures for the acquisition of data run according to the respectively selected embodiment of a method according to the invention. Of course, it is also possible for the control part 30 to be integrated, wholly or partially, in the computer 40.

For the purpose of performing a method according to the invention, the object which is to be examined is moved into the space surrounded by the coils 11, 11a, 12, 13, 14, and the HF-coil 15 is arranged in such a manner that the object area which is to be examined lies within its range of influence. Then, the HF-generator 23, the coil supply units 22, 22a and the selection circuit 50 are controlled in accordance with a selected program fed into the control part 30, in order to apply the required HF-, $B_z$- and gradient pulses for selected sequences and to select the occurring echo signals.

Figure 2:
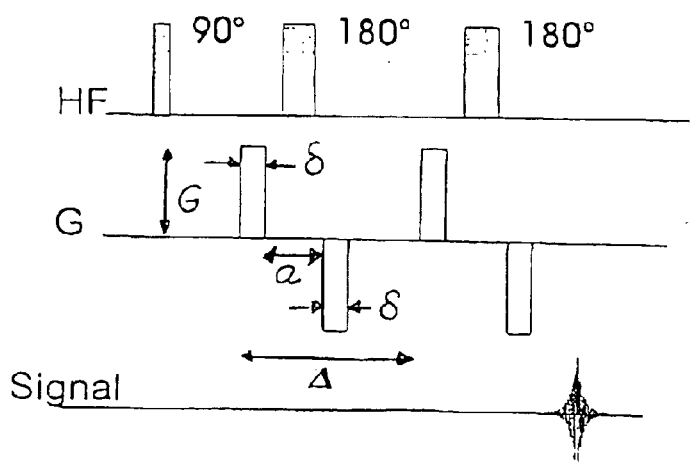
Figure 5:
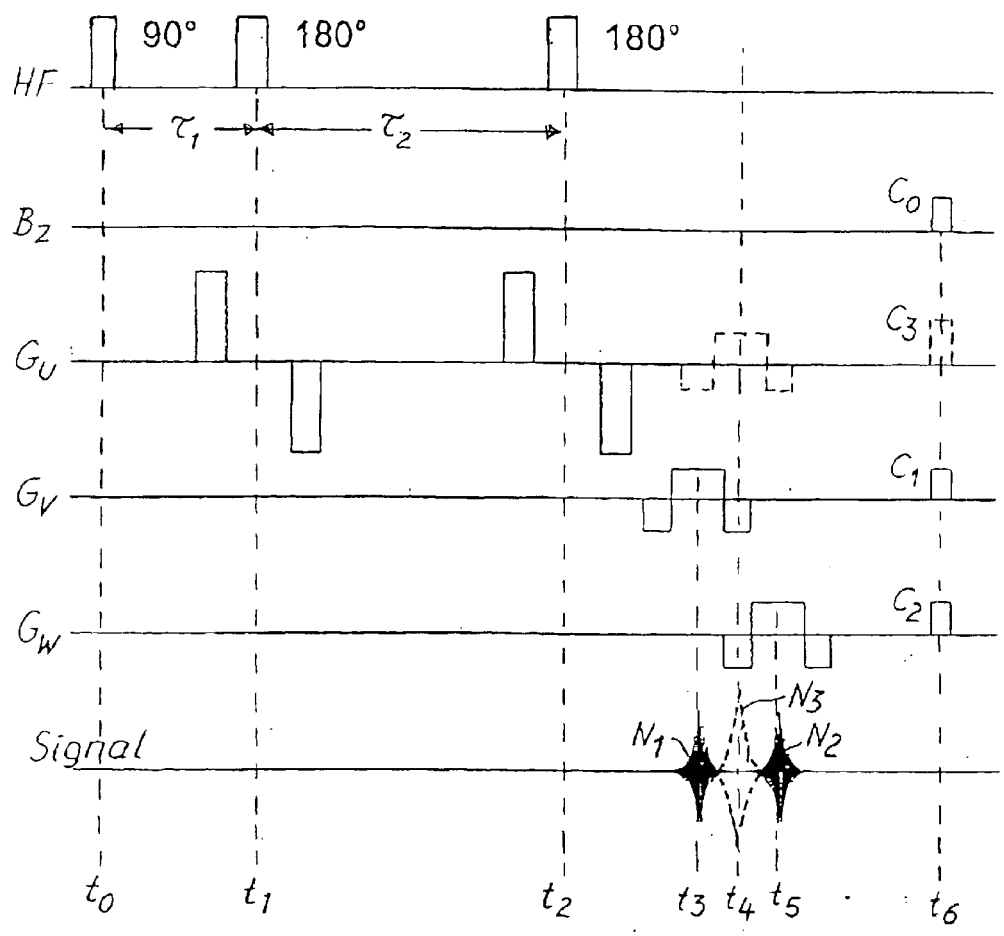
FIG. 5 shows in one diagram over a common time axis the sequence of HF- and magnetic field pulses and acquired navigator signals for a diffusion-weighting preparatory sequence with subsequent measurement and correction procedures.

In the case of the example shown in FIG. 5, an HF-excitation pulse with a flip-angle of 90° is firstly generated at time to, in order to excite transversal magnetisation of the spins in a selected area of the object. This is followed by the diffusion-weighting. In the illustrated case, the diffusion-weighting sequence takes the form of the experiment shown in FIG. 2, i.e. with bipolar diffusion gradient control and double spin echo, in order to minimise the effects of eddy currents, as is known per se (see [15]). Initially, a first "diffusion gradient" pulse is applied in any randomly desired spatial direction which may generally be defined as the U-direction. At time $t_1=t_0+\tau_1$, a 180°-pulse follows which is then followed by a second diffusion gradient pulse in the U-direction. In view of eddy currents, it is advantageous to apply the first diffusion gradient pulse as much as possible before this HF-pulse, and to apply the second diffusion gradient pulse immediately after this HF-pulse. At time $t_4=t_0+2\tau_1$ the maximum of a first spin echo occurs (not shown). After a further interval of $\tau_2>\tau_1$, as measured from $t_1$, the same sequence of diffusion gradient pulses and 180°-HF-pulse is repeated. At time $t_0+2\tau_2$, the maximum of a second echo signal occurs (not shown), as a spin echo of the first spin echo.

Each diffusion-weighting sequence ensures that the excited transversal magnetisation undergoes a desired attenuation, which is dependent upon the diffusion constant D, according to the above equation (1), but unfortunately it also undergoes undesired, movement-dependent phase changes which can be composed of a phase shift, which is caused by translation, and of a phase gradient which is caused by rotation. In the case of the example shown in FIG. 5, the phase shift is described by the above equation (5) and the phase gradient is described by the above equation (6). Both the desired attenuation and also the undesired phase changes are manifested in the said second spin echo.

The aforementioned undesired phase changes (phase shift and phase gradient) of the transversal magnetisation are the interference variables which in the image can cause the artefacts which are determined by movement and of which the data is acquired by means of a subsequent imaging sequence. In some imaging sequences, such as e.g. RARE, the phase shift produces much stronger artefacts than the phase gradient, whose influence under certain circumstances can be so small that it does not need to be corrected. However, FIG. 5 illustrates measures for compensating both for the phase shift and also for the phase gradient.

According to equation (6), a rotational movement of the object causes a phase gradient in the plane which is perpendicular to the U-direction (spatial direction of the diffusion gradient) and is referred to hereinunder as the "correction plane". As a result, the value and the direction of the phase gradient are determined in this correction plane and for compensation purposes a correspondingly dimensioned magnetic field gradient is applied in the opposite direction. The value and the direction of the phase gradient which is to be compensated can be revealed by the vector of the shift of the maximum signal intensity in the K-space which is allocated to the correction plane. This shift vector can be determined by scanning the said K-space. In most practical cases, it is sufficient to scan on only two axes which lie perpendicular with respect to each other and pass through the origin. To this end, the following procedure is employed in the example illustrated in FIG. 5:

In the correction plane which is perpendicular to the U-direction, a two-dimensional Cartesian system of co-ordinates is defined, whose axes directions are designated by the letters V and W. The components of the phase gradient (V-component and W-component) moving in these directions are measured separately from one another.

In order to measure the V- and W-component of the phase gradient, two gradient echoes $N_1$ and $N_2$ are generated consecutively during the second spin echo of the preparatory sequence, at times $t_3$ and $t_5$ a short time before and after $t_4$, the first gradient echo being generated by the application and subsequent polarity inversion of a magnetic field gradient in the V-direction ($G_v$-gradient). The echo $N_1$ which is refocussed by this switch of gradient is frequency-encoded in the V-direction in dependence upon the location. The second gradient echo $N_2$ is generated by the application and subsequent polarity inversion of a magnetic field gradient in the W-direction ($G_w$-gradient) and is frequency-encoded in the W-direction in dependence upon the location. Both magnetic field gradients are inverted once again prior to being switched off, in order to set their time integral to zero in each case.

The two gradient echoes $N_1$ and $N_2$ are selected as "navigator echoes" by corresponding scanning of the selection circuit 50 at the MR-device illustrated in FIG. 4 and are received by the correction control path 60 which is switched on at this time. Upon digitisation of the echo signals in the A/D-converter 61, the correction processor 62 determines the amplitude and the polarity of the phase gradient in each of the two echoes, in order thus to obtain the V-component and the W-component of the phase gradient of the transversal magnetisation. The phase gradient is proportional to the time displacement $\Delta t$ of the echo which can be established for example by measuring the time difference between the actual echo maximum and a reference time $t_{ref}$ at which the echo maximum would occur in the absence of a phase gradient.

The ascertained V-component of the phase gradient is used to calculate how great the time integral (amplitude over duration) of a magnetic field gradient pulse to be applied in the V-direction has to be, in order to compensate for this V-component. In a similar manner, the ascertained W-component of the phase gradient is used to calculate how great the time integral of a magnetic field gradient pulse to be applied in the W-direction has to be, in order to compensate for this W-component. The time integrals for the corrective magnetic gradient pulses can be calculated according to the following formula:

$$\int G_{corr} dt = -\Delta t \cdot G_{nav} \qquad \text{Equation (7)}$$

Where $G_{nav}$ is the amplitude of the magnetic field gradient during the relevant navigator echo $N_1$ and $N_2$. This then causes the actuation circuit 63 to actuate the supply unit 22 in such a manner that the gradient coils 12, 13 and 14 generate the corresponding corrective magnetic field gradient pulses $C_1$ and $C_2$ in the V-direction and W-direction respectively at time $t_6$. The result is that the V- and W-component of the phase gradient of the transversal magnetisation, as caused by the rotational movement of the object, i.e. the V- and W-components of the "first" order phase changes will disappear.

In order to correct the phase shift which is caused by the translation of the object, i.e. for the "zero" order phase correction, the phase of all spins must be changed uniformly to the required extent. There are various ways of achieving this. A first method in accordance with the invention is to amplify or attenuate the $B_0$-field temporarily, depending upon the direction and value of the phase shift which is to be corrected. For this purpose, it is possible preferably also at time $t_6$ to apply a corresponding dimensioned magnetic field pulse $C_0$ by means of the $B_z$-coil 11a, controlled by the associated supply unit 22a, the time integral of said magnetic field pulse (amplitude of the field strength B over duration) can likewise be calculated in the correction processor 62 from one of the navigator echoes, and furthermore using the following formula:

$$\int B_{corr} dt = -\frac{\Delta \Phi}{\gamma} \qquad \text{Equation (8)}$$

where $\Delta\Phi$ is the phase shift of the relevant navigator echo with respect to a reference phase $\Phi_{ref}$ which the echo would have without diffusion-weighting.

A second inventive method of first order phase correction is to change the phase of specific HF-pulses during or prior to the imaging sequence. In the event that this sequence operates with HF-refocussing (such as e.g. a RARE-sequence), the zero order phase correction can be achieved by changing the phase of the refocussing HF-pulses by $\Delta\Phi+\pi$ or $\Delta\Phi-\pi$.

The reference time $t_{ref}$ for the measurement of $\Delta t$ and the reference phase $\Phi_{ref}$ for the measurement of $\Delta\Phi$ can be determined by calculation or experiment. The reference time $t_{ref}$ can be determined, for example, by detection or calculation of the point in time at which the current time integral passes over the alternating gradient pulse sequence, which produces the navigator gradient echo, for the first time back to zero. The reference phase can be determined by fixed calibration of the MR-device, so that the phase of the spin echo (time $t_4$) can always be calculated. This phase also corresponds to the phase which the navigator echoes have, if no translatory movement occurs, and thus represents the reference phase.

A purely experimental determination of the reference variables $t_{ref}$ and $\Phi_{ref}$ can be performed using a separate reference pre-experiment, in which the navigator echoes are generated in the same manner as in the useful experiment, but with no diffusion gradient or with a negligibly weak diffusion gradient. In this case, the point in time of the maximum and the actual phase of the respective navigator echo are measured and stored as variables $t_{ref}$ and $\Phi_{ref}$ respectively, in order during the subsequent useful experiment to determine the time shift $\Delta t$ and the phase shift $\Delta\Phi$ in the diffusion-weighted navigator echoes. The reference pre-experiment can be performed with or without an imaging sequence and can be repeated on several occasions as desired, in order to average the individual results.

If the scheme of diffusion-weighting does not have a definite direction, as in the case of schemes which measure the trace of the diffusions tensor in a single experiment, it can be necessary to scan a three-dimensional K-space with the navigator. To this end, it is necessary to generate a third navigator echo $N_3$ with frequency-encoding in the U-direction and to generate a correction magnetic field gradient pulse $C_3$ derived therefrom in this direction, as indicated by broken lines in FIG. 5.

Figure 6:
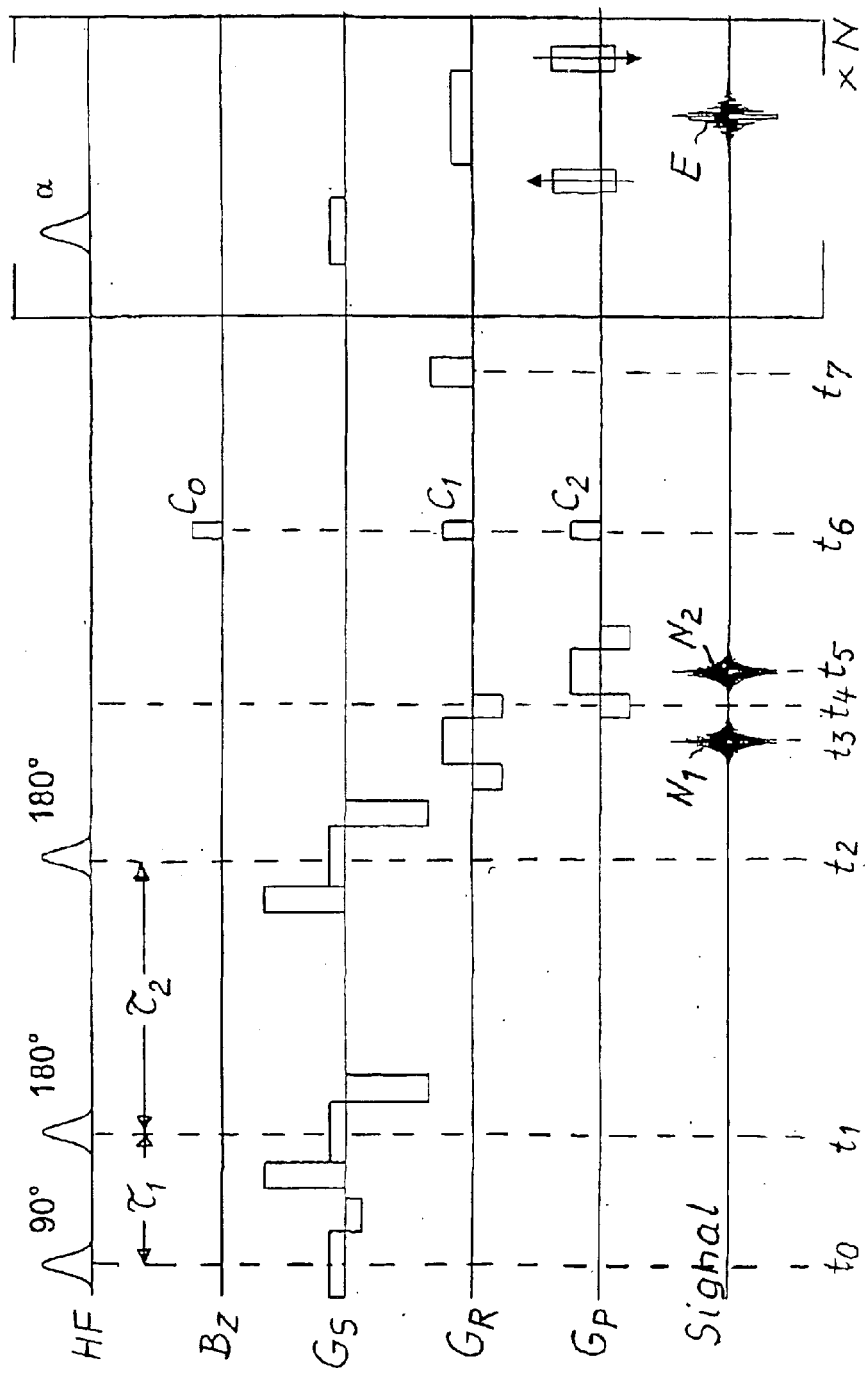
FIG. 6 shows in one diagram over a common time axis the HF- and magnetic field pulses and the MR-signals of a diffusion-weighting preparatory sequence, the measuring and correction sequence and a RARE-imaging sequence.

FIG. 6 shows as an example a combination of the sequence shown in FIG. 5 of diffusion-weighting, navigator generation and movement correction with a RARE-imaging sequence. In FIG. 6, the lines designated as $G_S$, $G_R$ and $G_P$ indicate the magnetic field gradients in the directions of the object-scanning of the imaging sequence, i.e. the gradients in the layer direction (S-direction), the read direction (R-direction) and the phase-encoding direction (P-direction).

As shown in FIG. 6, the 90°-HF-excitation pulse is applied at time $t_0$ as a layer-selective pulse, in the presence of a $G_S$-gradient as a layer gradient, so that transversal magnetisation is only excited within a thin layer, of which the plane lies perpendicular to the S-direction. Upon completion of the HF-excitation pulse, the polarity of the layer gradient is temporarily inverted prior to it being switched off, in order to cancel the defocussing of the spins produced by the gradient.

This is then followed by diffusion-weighting, navigator-movement and movement-correction, as described above with reference to FIG. 5, only that the two 180°-HF-pulses of the diffusion-weighting sequence are applied as layer-selective pulses in each case in the presence of a $G_S$-gradient.

Furthermore, in the illustrated example the direction of the diffusion gradients (U-direction in FIG. 5) is the same as the S-direction of the object-scanning in the imaging sequence, so that the V- and W-components of the phase gradient which cause the artefact lie precisely in the image plane, i.e. can be treated as components in the R-direction and in the P-direction. Accordingly, in the case of FIG. 5, the navigator echoes $N_1$ and $N_2$ are encoded in the R- and P-direction respectively, and the corrective magnetic field gradient pulses $C_1$ and $C_2$ are applied in the R- and P-direction respectively.

Subsequently, after the correction control path 60 is switched off and the magnetic field gradient control is switched on again in the control unit 30, the actual imaging sequence follows, in the present example this is a RARE-sequence with N consecutive periodic cycles. Prior to the first cycle of the RARE-sequence, at time $t_7$ a so-called "Read-Dephase"-magnetic field gradient pulse is also applied in the R-direction which ensures that the useful echoes E of the RARE-sequence fall into the centre of the respective acquisition windows. Each of the RARE-cycles begins in the usual way with a layer-selective HF-refocussing pulse, followed by a phase-encoding magnetic field gradient pulse in the P-direction, subsequent detection of the refocussed spin echo in the presence of a read gradient pulse moving in the R-direction, followed by a rewinder gradient pulse in the P-direction which cancels the phase-encoding. The amplitude of the phase-encoding and rewinder pulses is changed from cycle to cycle in order to fill the various lines of the K-space used to reconstruct the image. All of these procedures are executed in a conventional manner via the computer 40 and the control part 30 of the MR-device illustrated in FIG. 4.

Using the complete sequence described above with reference to FIG. 6, various experiments were performed in vivo on a healthy human brain. The MR-device used was the "3T/100 Medspec" model produced by Bruker which can switch magnetic field gradients of 45 mT/m within 320 µs. For the purpose of HF-excitation and measurement, the transmitter/receiver 15 was provided with a bird cage resonator 280 mm in diameter. The pictures were triggered in time relation to a simultaneously recorded EKG.

With respect to the correction control path 60 (FIG. 4), a separate board was used for the real-time data measurement and processing with a dedicated A/D-converter 61 under the control of a PC which formed the correction processor 62. A 16 bit D/A-converter was used in the actuation circuit 63.

The diffusion-weighting preparatory sequence was performed with a total echo time $2\tau_2$ of 92 ms and the diffusion-weighting was fixed to a b-value of 804 s/mm². Beforehand, in a reference pre-experiment repeated several times, a data record with a negligible degree of diffusion-weighting was acquired and the navigator echoes thus obtained were averaged in order to provide average values for the phase and the time of the echo maximum, as reference variables for the calculation of the correction.

The echo data was scanned on the correction control path at a frequency of 104 kHz and a resolution of 14 bit. The position of the respective echo maximum was determined by means of quadratic three-point interpolation. Phase shifts and gradients in the diffusion-weighted navigator echoes were measured in relation to the reference mentioned. The first navigator echo was used to calculate the zero order correction and the strength of the measured phase gradients in the two navigator echoes was used to calculate the amplitude of the two corrective magnetic field gradient pulses in the R- and P-direction.

Preferably, as occurred in the cases reported herein, the navigator echoes obtained are then only actually used for the correction, if their amplitude is a certain minimum value above the noise level (more than 10 times in the reported cases). This is normally to be expected for the EKG-based triggering.

The configuration described renders it possible to digitise the navigator echoes within 800 µs and to calculate and output the corrective magnetic field pulses. The eddy current correction coil already provided in the MR-device used was used as the $B_z$-coil 11a (FIG. 4). Steps were taken to ensure that the output of the correction impulses did not coincide with any of the magnetic field gradient pulses which were used in the actual imaging sequence. However, in principle, the correction pulses can also be added to the respective first magnetic field gradient pulses of the imaging sequence. The duration of all correction pulses was fixed to 1 ms, therefore the total measuring and correction time was less than 2 ms. In total it took 5.6 ms to generate the two navigator echoes, including the refocussing and defocussing gradient pulses used in this case.

The subsequent RARE-imaging sequence was performed preferably using Gaussian HF-refocussing pulses with a flip-angle of 120°. This permits shorter repetition times without the risk of excessively high power coupling into the object, so that more echoes can be acquired within the sequence. The layer thickness was dimensioned to 5 mm and the echo data of the RARE-sequence was read by the dedicated computer 40 of the device with an acquisition bandwidth of 25 kHz and was written into the K-space in the form of a 256×256-matrix. The RARE-factor (number of echoes per excitation) was 16, the echo time of the RARE-sequence was 18.8 ms.

Figure 7:
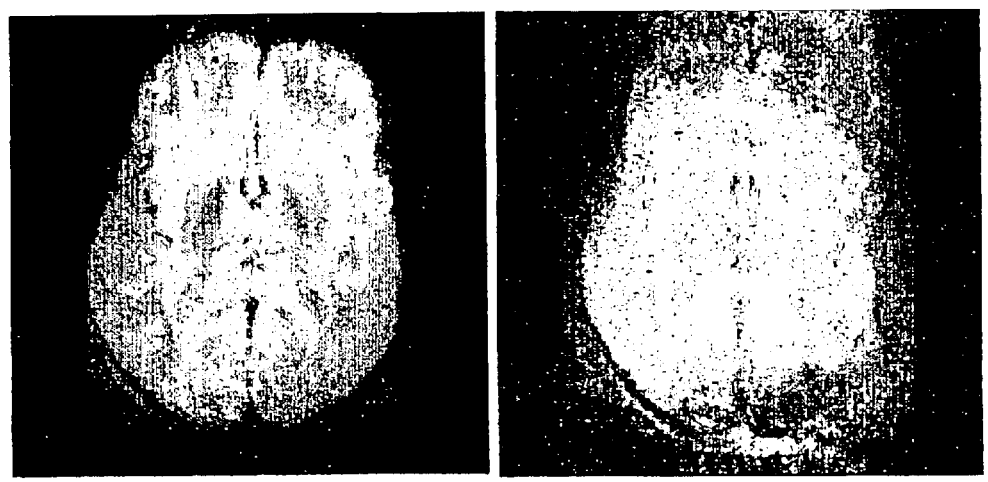
FIG. 7 shows two layered images of the respectively same object area, as recorded with and without the correction in accordance with the invention.

FIG. 7 shows on the left-hand side an MR-image of a layer of the healthy brain using the diffusion-weighted and movement-corrected RARE-sequence with the above-described device and sequence parameters, wherein the trigger action was performed 400 ms after detection of the R-wave of the EKG. In comparison, the image of the right shows a picture of the same object area recorded using the same parameters as in the picture on the left, including the EKG-based trigger action, but with the movement-correction switched off. The movement artefacts which appear therein are clearly significant. In contrast, the image on the left is practically free of artefacts, it clearly shows two portions of the corpus callosum, the splenium and the forceps major as a hyper-intense structure on the middle line. Furthermore, parts of the basalganglia (in particular the head portion of the nucleus caudatus) are evident on both sides as hyper-intense structures. The capsula interna is clearly identifiable in all portions (front and rear limbs and knee area), as is the thalmus.

Figure 1:
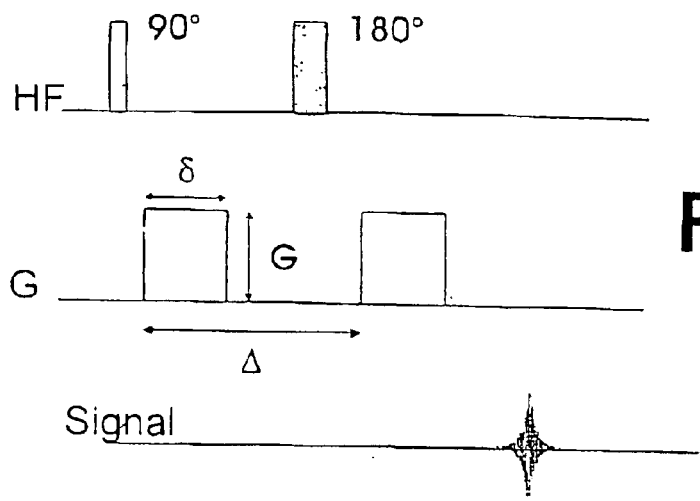
Figure 3:
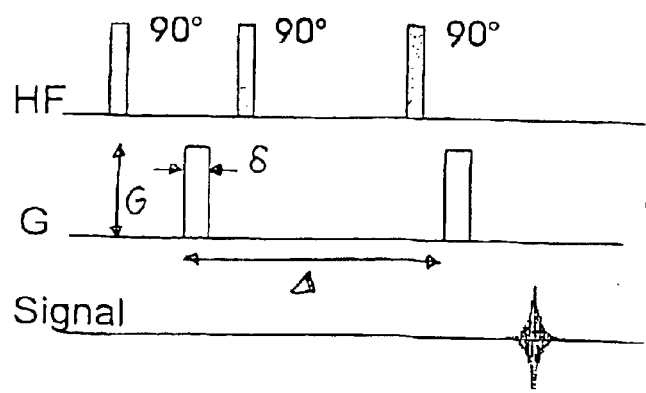

Of course, in addition to the exemplified embodiment described above with reference to FIG. 6, other embodiments or modifications are also possible within the scope of the inventive idea. As far as the configuration of the diffusion-weighting preparatory sequence is concerned, it is also possible to use any other variations, e.g. the standard form of the Stejskal-Tanner-Experiment in accordance with [1], as shown in FIG. 1, or the version with the generation of a diffusion-weighted stimulated echo instead of a spin echo, as shown in FIG. 3.

If the direction of the diffusion gradients does not coincide with the S-direction of the imaging sequence, but rather lies somehow oblique thereto, then it is naturally also possible for these gradients to have components in the R- and P-direction of the object-scanning. Of course, in such cases the plane perpendicular to the direction of the diffusion gradient does not coincide with the R-P-image plane. Nevertheless, it may be sufficient in some cases to apply correction magnetic field gradients only in the directions of this plane. However, in each case it is possible to achieve improved results if the directions of the frequency-encoding of the navigator echoes and the directions of the correction magnetic field gradients are placed in precisely the plane perpendicular to the direction of the diffusion gradient. In this case, the frequency-encoding gradients and the correction gradients can each have components in the S-, R- and P-direction.

Spin echoes or stimulated echoes can also be acquired as navigator echoes instead of the gradient echoes illustrated in FIG. 6. If a navigator echo is only used for the purpose of calculating the zero order phase correction, it obviously does not require any frequency-encoding.

As already indicated, the invention is also not limited to RARE-imaging sequences. Therefore, it is also possible to apply, for example, the online correction in accordance with the invention in conjunction with any other spin echo imaging sequences which operate with HF-refocussing after HF-excitation, such as e.g. GRASE, cf. [16], or spin echo-EPI, cf. [17]. As stated, the zero order phase correction can be effected by changing the phase of the refocussing pulses by $\Delta\Phi\pm\pi$.

However, it also possible to apply the invention just as effectively in conjunction with imaging sequences which begin with new HF-excitation pulses after the diffusion-weighting, such as e.g. the aforementioned FLASH and STEAM sequences. However, at the time of the last spin echo before the commencement of the imaging sequence, it is necessary in this case to introduce a DEFT-pulse with a flip-angle of 90° which rotates the transversal magnetisation on to the longitudinal axis. In order to achieve zero order phase correction, only this 90°-DEFT-pulse needs to undergo a phase change of $\Delta\Phi$.

Figure 8:
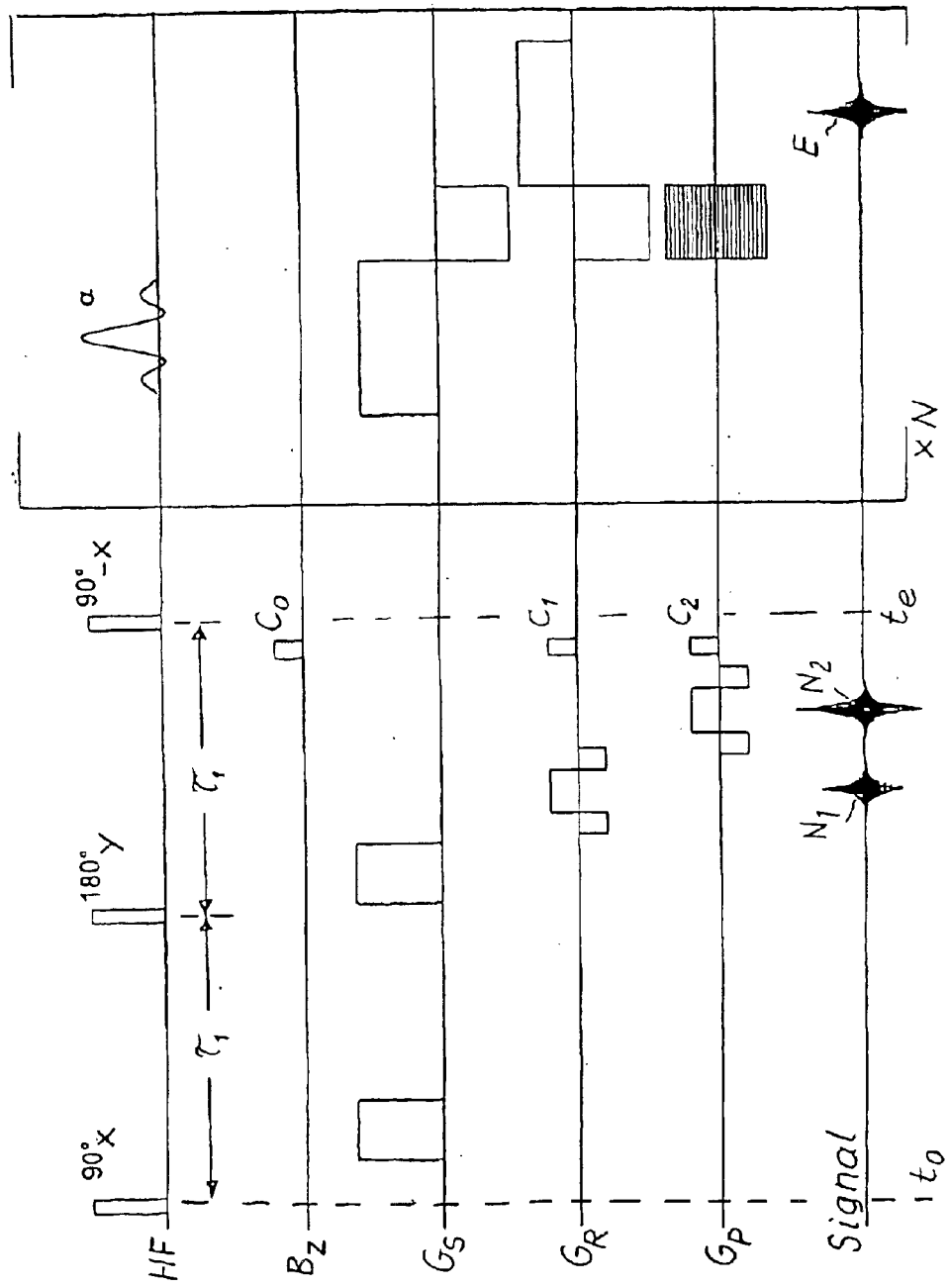
FIG. 8 shows in one diagram over a common time axis the HF- and magnetic field pulses and the MR-signals of a diffusion-weighting preparatory sequence, the measuring and correction sequence and a FLASH-imaging sequence.

FIG. 8 shows as an example a FLASH-imaging sequence, consisting of N partial experiments (on the right-hand side in the Figure) with in each case one layer-selective HF-excitation pulse α<90°, a layer gradient in the S-direction with refocussing polarity inversion, followed by a phase-encoded gradient in the P-direction which is changed from partial experiment to partial experiment, and a read gradient in the R-direction, the polarity inversion of which produces a gradient echo as a useful echo E.

In the example as shown in FIG. 8, the diffusion-weighting is performed by means of the Stejskal-Tanner-Experiment as shown in FIG. 1, wherein the diffusion gradients are applied in the S-direction as in the case of FIG. 6. After time period $\tau_1$, the 90°-excitation pulse which is applied at time $t_0$, is followed by the 180°-refocussing pulse, so that at time $t_e=t_0+\tau_2$ the centre of the spin echo appears, where the 90°-DEFT-pulse is applied in such a manner that it drives the transversal magnetisation from the X-Y-plane back to the longitudinal Z-axis. The phase of the DEFT-pulse which is required for this purpose depends in a known manner upon the phase of the preceding HF-pulses; one possible phase scheme (+x, +y, -x) is recorded in FIG. 8. During the rising branch of the spin echo, where possible shortly before $t_e$, the two navigator echoes $N_1$ and $N_2$ are generated as gradient echoes with frequency-encoding in the R- and P-direction respectively, similar to the case in FIG. 6. In the same manner as described above with reference to FIGS. 5 and 6, these navigator echoes can then be used to determine and apply the magnetic field gradient pulses $C_1$ and $C_2$, which compensate for the phase gradient, in the R- and P-direction respectively for the purpose of first order phase correction, and to determine and apply the $B_z$-magnetic field pulse $C_0$ for zero order phase correction. As stated, the zero order correction can also alternatively be performed by changing the phase of the DEFT-pulse by $\Delta\Phi$.

In the case of the examples described above with reference to FIG. 5, 6 and 8, the phase gradient to be corrected is determined by scanning the respective correction plane in the K-space on only two perpendicular axes (V and W in the case of FIG. 5; R and P in the case of FIGS. 6 and 8). In certain circumstances, this may be insufficient. If particularly in the case of relatively large phase gradients the orientation of this gradient does not coincide with one of the two axes, the intensity of one of the navigator echoes may be too low to derive a correction. In such cases, it is better to scan the area of the K-space, preferably by means of a spiral navigator scanning pattern as is known per se in [19]. The shift which has the maximum signal intensity in the K-space with respect to the origin of the co-ordinates can be used to determine the direction and value of the phase gradient in a precise manner in each case, in order to dimension in a correct manner the correction magnetic field gradient to be applied. Any other scanning scheme can also be used for the scanning procedure.

The principle of the "online" correction in accordance with the invention is not limited to scanning methods, in which the location is selected within a two-dimensional image plane by combined frequency- and phase-encoding in two fixed spatial directions and the image is reconstructed by means of a two-dimensional Fourier-transformation of the K-space (2D-FT). The invention can be applied just as effectively in the case of the spiral scanning procedure which has already been mentioned above and is known per se from [18], or also in the case of "Projection Reconstruction" (PR), in which instead of phase-encoding, a read gradient is used which is rotated stepwise from partial experiment to partial experiment.

In general, the invention can be accomplished with practically any magnetic resonance imaging method, in which the transversal magnetisation which is excited in the object to be imaged is diffusion-weighted prior to the generation of the useful echoes utilised for the reconstruction of an image. In summary, the principle of the invention is to measure the disturbing phase changes, which occur in the diffusion-weighted transversal magnetisation as a result of object movement and lead to artefacts in the reconstructed image, by analysing a navigator signal which is generated prior to the production of the useful echoes, and to use the result of this measurement to change the phase characteristic of the transversal magnetisation online by means of a corrective intervention in such a way as to compensate for the measured phase changes.

What is claimed is:

1. Method of acquiring data for the illustration of an image which shows the spatial distribution of the magnetic resonance behavior of an object within a selected object area which is disposed in a stationary and the most homogenous possible longitudinal magnetic field and is subjected to a sequence of HF-pulses and magnetic field gradient pulses in different spatial directions, such that a sequence of useful echoes (E), encoded in dependence upon the location, of the magnetisation which is transversal with respect to the stationary magnetic field is produced which useful echoes are acquired as a data record for the reconstruction of the image to be illustrated, wherein between an HF-pulse which excites the transversal magnetisation and the production of the useful echoes (E) a diffusion-weighting sequence is introduced which leads to an attenuation in the transversal magnetisation which is dependent upon the diffusion procedures in the selected object area, and wherein from this diffusion-weighted transversal magnetisation a navigator signal is produced by echo-generation ($N_1$, $N_2$, $N_3$) and its characteristic is used as information for the correction of image artifacts which are produced by movement of the object characterised in that prior to the production of the useful echoes (E) at least one of those interference variables in the phase characteristic of the navigator signal ($N_1$, $N_2$, $N_3$), which would cause the said image artefacts, is measured, and that the result of this measurement is utilised in order to change the phase characteristic of the transversal magnetisation, from which the useful echoes are generated, for the purpose of compensating for the measured variable.

2. Method as claimed in claim 1, characterised in that the zero order phase shift in the navigator signal (e.g. $N_1$) is measured as an interference variable in relation to a reference phase which is produced when there is no diffusion-weighting or the diffusion-weighting is negligibly weak, and that a homogenous magnetic field pulse ($C_0$) which is dimensioned to compensate for this phase shift is applied in the direction of the stationary longitudinal magnetic field.

3. Method as claimed in claim 2, characterised in that the reference phase is determined by measuring the phase of a corresponding navigator signal which is generated in at least one preceding reference experiment with negligibly weak diffusion-weighting or with no diffusion-weighting.

4. Method as claimed in claim 1, characterised in that the zero order phase shift $\Delta\Phi$ is measured as an interference variable in relation to a reference phase which is produced when there is no diffusion-weighting or the diffusion-weighting is negligibly weak, and that the phase of subsequent HF-pulses is changed to such an extent as to compensate for the measured phase shift $\Delta\Phi$.

5. Method as claimed in claim 4, characterised in that the transversal magnetisation for the useful echoes is newly excited by at least one HF-excitation pulse which is generated after the diffusion-weighting, and that prior to the first new excitation of the transversal magnetisation for the useful echoes an HF-pulse with a flip-angle of 90° is applied which drives the previous transversal magnetisation back in the longitudinal direction (DEFT-pulse) and its phase is shifted by $\Delta\Phi$.

6. Method as claimed in claim 4, characterised in that the useful echoes (E) are produced using refocussing HF-pulses, and that the phase of these HF-refocussing pulses is changed in each case by $\Delta\Phi+\pi$ or $\Delta\Phi-\pi$.

7. Method as claimed in claim 1, characterised in that the spatial gradient of the phase of the transversal magnetisation is measured as an interference variable, and that a magnetic field gradient pulse ($C_1$, $C_2$, $C_3$) which is dimensioned to compensate for this phase gradient is applied.

8. Method as claimed in claim 7, characterised in that the navigator signal is generated in the form of at least two navigator echoes ($N_1$, $N_2$, $N_3$), each of which is frequency-encoded and detected in dependence upon the location in a spatial direction which is allocated to precisely this echo, and that each detected navigator echo ($N_1$, $N_2$, $N_3$) is used to determine the phase gradient of the transversal magnetisation which moves in the respectively allocated spatial direction, and that in each of the allocated spatial directions a respective magnetic field gradient pulse ($C_1$, $C_2$, $C_3$) is generated which compensates for the phase gradient of the transversal magnetisation which is determined for this direction.

9. Method as claimed in claim 8, characterised in that two of the navigator echoes ($N_1$, $N_2$) are frequency-encoded in different and preferably mutually perpendicular spatial directions in the particular plane which is perpendicular to the direction of the magnetic field gradients applied for the diffusion-weighting.

10. Method as claimed in claim 8, characterised in that two of the navigator echoes ($N_1$, $N_2$) are frequency-encoded in different and preferably mutually perpendicular spatial directions in the particular plane which corresponds to the image plane which is to be illustrated.

11. Method as claimed in claim 8, characterised in that a third one of the navigator echoes ($N_3$) is frequency-encoded in the particular spatial direction which is perpendicular to the plane of the frequency-encoding directions of the two other navigator echoes ($N_1$, $N_2$).

12. Method as claimed in claim 8, characterised in that in order to determine the phase gradient the time shift $\Delta t$ of the maximum of the relevant navigator echo ($N_1$, $N_2$, $N_3$) is measured with respect to a reference time, at which the maximum would appear when there is no diffusion-weighting or the diffusion-weighting is negligibly weak, and that the time integral of the amplitude over the duration of the magnetic field gradient pulse ($C_1$, $C_2$, $C_3$), which compensates for the phase gradient, is dimensioned to be equal to $-\Delta G_{nav}$, where $G_{nav}$ is the amplitude of the magnetic field gradient which frequency-encodes the navigator echo.

13. Method as claimed in claim 12, characterised in that the reference time is determined by measuring the time of the maximum of a corresponding navigator echo which is generated in at least one preceding reference experiment with negligibly weak diffusion-weighting or with no diffusion-weighting.

14. Method as claimed in claim 7, characterised in that the navigator signal is scanned over the area of the K-space of a plane which is perpendicular to the direction of the magnetic field gradients applied for diffusion-weighting, and that the value and direction of the phase gradient of the transversal magnetisation are determined from the shift, which the location of the maximum signal intensity has in this K-space with respect to the origin of the co-ordinates.

15. Method as claimed in claim 14, chracterised in that the scanning performed over the area of the K-space is a spiral-scanning procedure.

16. Method as claimed in claim 7, characterised in that the navigator signal is scanned over the area of the K-space of a plane which corresponds to the image plane which is to be illustrated, and that the value and direction of the phase gradient of the transversal magnetisation are determined from the shift which the location of the maximum signal intensity has in this K-space with respect to the origin of the co-ordinates.

17. Device for the acquisition of data for the illustration of an image which shows the spatial distribution of the magnetic resonance behaviour of an object within a selected location area, having a device (11, 11*a*, 21, 22*a*) for generating a homogenous magnetic field along a longitudinal axis in the object area to be examined, a device (15, 23) for generating HF-pulses which act upon the object area, devices (12, 13, 14, 22) for generating magnetic field gradients in different spatial directions in the object area, a device (50) for selecting the magnetic resonance signals emanating from the object area, and a control device (30, 40, 60) which upon activation controls the generation of the HF-pulses and the magnetic field gradients and the selection of the magnetic resonance signals in such a manner that the object area is subjected to a sequence of HF- and magnetic field gradient pulses, in order to produce a sequence of useful echoes (E), encoded in dependence upon the location, of the magnetisation which is transversal to the stationary magnetic field, which useful echoes form the data record for the reconstruction of the image to be illustrated, and in order to introduce between an HF-pulse, which excites the transversal magnetisation, and the production of the useful echoes (E), a diffusion-weighting sequence which leads to an attenuation in the transversal magnetisation which is dependent upon diffusion procedures in the selected object area, and in order from this division-weighted transversal magnetisation to produce a navigator signal by echo-generation ($N_1$, $N_2$, $N_3$), the characteristic of said navigator signal being used as information for the correction of image artefacts which are produced by movement of the object, characterised by a configuration of the control device (30, 40, 60) such that upon activation thereof prior to the production of the useful echoes (E) at least one of those interference variables in the phase characteristic of the navigator signal ($N_1$, $N_2$, $N_3$), which would cause the said image artefacts, is measured and the phase characteristic of the transversal magnetisation, from which the useful echoes are generated, is changed for the purpose of compensating for the respectively measured variable.

18. Device as claimed in claim 17, characterised by a configuration of the control device (30, 40, 60) such that upon activation thereof the zero order phase shift in the navigator signal (e.g. ($N_1$) is measured as an interference variable in relation to a reference phase which is produced when there is no diffusion-weighting or the diffusion-weighting is negligibly weak, and a homogenous magnetic field pulse ($C_0$) which is dimensioned to compensate for this phase shift is applied in the direction of the stationary longitudinal magnetic field.

19. Device as claimed in claim 18, characterised by a configuration of the control device (30, 40, 60) such that upon activation thereof the reference phase is determined by measuring the phase of a corresponding navigator signal which is generated in at least one preceding reference experiment with negligibly weak diffusion-weighting or with no diffusion-weighting.

20. Device as claimed in claim 17, characterised by a configuration of the control device (30, 40, 60) such that upon activation thereof the zero order phase shift $\Delta\Phi$ is measured as an interference variable in relation to a reference phase which is produced when there is no diffusion-weighting the diffusion-weighting is negligibly weak, and the phase of subsequent HF-pulses is changed to such an extent as to compensate for the measured phase shift $\Delta\Phi$.

21. Device as claimed in claim 20, characterised by a configuration of the control device (30, 40, 60) such that upon activation thereof the transversal magnetisation for the useful echoes is newly excited by means of at least one HF-excitation pulse which is generated after the diffusion-weighting, and prior to the first new excitation of the transversal magnetisation for the useful echoes an HF-pulse with a flip-angle of 90° is applied which drives the previous transversal magnetisation back in the longitudinal direction (DEFT-pulse) and its phase is shifted by $\Delta\Phi$.

22. Device as claimed in claim 20, characterised by a configuration of the control device (30, 40, 60) such that upon activation thereof the useful echoes (E) are generated using refocussing HF-pulses, and the phase of these HF-refocussing pulses is changed in each case by $\Delta\Phi+\pi$ or $\Delta\Phi-\pi$.

23. Device as claimed in claim 17, characterised by a configuration of the control device (30, 40, 60) such that upon activation thereof the spatial gradient of the phase of the transversal magnetisation is measured as an interference variable, and a magnetic field gradient pulse ($C_1$, $C_2$, $C_3$) which is dimensioned to compensate for this phase gradient is applied.

24. Device as claimed in claim 23, characterised by a configuration of the control device (30, 40, 60) such that upon activation thereof the navigator signal is generated in the form of at least two navigator echoes ($N_1$, $N_2$, $N_3$), each of which is frequency-encoded and detected in dependence upon the location in a spatial direction which is allocated to precisely this echo, and each detected navigator echo ($N_1$, $N_2$, $N_3$) is used to determine the phase gradient of the transversal magnetisation which moves in the respectively allocate spatial direction, and in each of the allocated spatial directions a respective magnetic field gradient pulse ($C_1$, $C_2$, $C_3$) is generated which compensates for the phase gradient for the transversal magnetisation which is determined for this direction.

25. Device as claimed in claim 24, characterised by a configuration of the control device (30, 40, 60) such that upon activation thereof two of the navigator echoes ($N_1$, $N_2$) are frequency-encoded in different and preferably mutually perpendicular spatial directions in the particular plane which is perpendicular to the direction of the magnetic field gradients applied for the diffusion-weighting.

26. Device as claimed in claim 25, characterised by a configuration of the control device (30, 40, 60) such that upon activation thereof a third one of the navigator echoes ($N_3$) is frequency-encoded in the particular spatial direction which is perpendicular to the plane of the frequency-encoding directions of the two other navigator echoes ($N_1$, $N_2$).

27. Device as claimed in claim 24, characterised by a configuration of the control device (30, 40, 60) such that upon activation thereof two of the navigator echoes ($N_1$, $N_2$) are frequency-encoded in different and preferably mutually perpendicular spatial directions in the particular plane which corresponds to the image plane which is to be illustrated.

28. Device as claimed in claim 24, characterised by a configuration of the control device (30, 40, 60) such that upon activation thereof in order to determine the phase gradient the time shift $\Delta t$ of the maximum of the relevant navigator echo ($N_1$, $N_2$, $N_3$) is measured with respect to a reference time, at which the maximum would appear when there is no diffusion-weighting or the diffusion-weighting is negligibly weak, and the time integral of the amplitude over the duration of the magnetic field gradient pulse ($C_1$, $C_2$, $C_3$), which compensates for the phase gradient, is dimensioned to be equal to $-\Delta t \cdot G_{nav}$, where $G_{nav}$ is the amplitude of the magnetic field gradient which frequency-encodes the navigator echo.

29. Device as claimed in claim 28, characterised by a configuration of the control device (30, 40, 60) such that upon activation thereof the reference point is determined by measuring the time of the maximum of a corresponding navigator echo which is generated in at least one preceding reference experiment with negligibly weak diffusion-weighting or with no diffusion-weighting.

30. Device as claimed in claim 23, characterised by a configuration of the control device (30, 40, 60) such that upon activation thereof the navigator signal is scanned over the area of the K-space of a plane which is perpendicular to the direction of the magnetic field gradients applied for the diffusion-weighting, and the value and direction of the phase gradient of the transversal magnetisation are determined from the shift which the location of the maximum signal has in this K-space with respect to the origin of the co-ordinates.

31. Device as claimed in claim 30, characterised by a configuration of the control device (30, 40, 60) such that upon activation thereof the scanning performed over the area of the K-space is a spiral-scanning procedure.

32. Device as claimed in claim 23, characterised by a configuration of the control device (30, 40, 60) such that upon activation thereof the navigator signal is scanned over the area of the K-space of a plane which corresponds to the image plane which is to be illustrated, and the value and direction of the phase gradient of the transversal magnetisation are determined from the shift which the location of the maximum signal intensity has in this K-space with respect to the origin of the co-ordinates.

* * * * *

UNITED STATES PATENT AND TRADEMARK OFFICE
CERTIFICATE OF CORRECTION

| | |
|---|---|
| PATENT NO. | : 6,842,000 B2 |
| APPLICATION NO. | : 10/468159 |
| DATED | : January 11, 2005 |
| INVENTOR(S) | : David Norris et al. |

It is certified that error appears in the above-identified patent and that said Letters Patent is hereby corrected as shown below:

Title page, after "(73) Assignee:" change the name of the Assignee to read: --Max-Planck-Gesellschaft zur Forderung der Wissenschaften E.V., Munich (DE) --.

Signed and Sealed this

Eighteenth Day of September, 2007

JON W. DUDAS
*Director of the United States Patent and Trademark Office*